(12) United States Patent
Gopinath

(10) Patent No.: US 6,542,527 B1
(45) Date of Patent: Apr. 1, 2003

(54) VERTICAL CAVITY SURFACE EMITTING LASER

(75) Inventor: Anand Gopinath, Wayzata, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 09/378,792

(22) Filed: Aug. 23, 1999

Related U.S. Application Data

(60) Provisional application No. 60/098,096, filed on Aug. 27, 1998.

(51) Int. Cl.$^7$ ................................................ H01S 5/10
(52) U.S. Cl. ...................................................... 372/45
(58) Field of Search ............................... 372/43, 44, 45, 372/46, 99; 257/9, 12, 13; 438/22, 29

(56) References Cited

U.S. PATENT DOCUMENTS

| | | | |
|---|---|---|---|
| 5,086,430 A | 2/1992 | Kapon et al. | 372/50 |
| 5,245,622 A | 9/1993 | Jewell et al. | 372/45 |
| 5,295,147 A | 3/1994 | Jewell et al. | 372/45 |
| 5,317,587 A | 5/1994 | Ackley et al. | 372/45 |
| 5,343,487 A | 8/1994 | Scott et al. | 372/46 |
| 5,345,462 A | 9/1994 | Choquette | 372/45 |
| 5,351,257 A | 9/1994 | Lebby et al. | 372/46 |
| 5,359,447 A | 10/1994 | Hahn et al. | 359/154 |
| 5,387,543 A | 2/1995 | Ackley | 438/41 |
| 5,426,657 A | 6/1995 | Vakhshoori | 372/45 |
| 5,446,732 A | 8/1995 | Miyamoto | 370/384 |
| 5,446,752 A * | 8/1995 | Ackley et al. | 372/46 |
| 5,446,753 A | 8/1995 | Yoshida | 372/46 |
| 5,461,637 A | 10/1995 | Mooradian et al. | 372/92 |
| 5,553,185 A | 9/1996 | Antos et al. | 385/127 |
| 5,559,053 A | 9/1996 | Choquette et al. | 438/41 |
| 5,574,738 A | 11/1996 | Morgan | 372/28 |
| 5,594,751 A | 1/1997 | Scott | 372/46 |
| 5,604,628 A | 2/1997 | Parker et al. | 359/344 |
| 5,619,318 A | 4/1997 | Yamamoto et al. | 356/32 |
| 5,745,515 A | 4/1998 | Marta et al. | 372/45 |
| 5,753,941 A | 5/1998 | Shin et al. | 257/98 |
| 5,754,578 A | 5/1998 | Jayaraman | 372/50 |
| 5,757,837 A | 5/1998 | Lim et al. | 372/50 |
| 5,764,674 A | 6/1998 | Hibbs-Brenner et al. | 372/46 |
| 5,773,319 A | 6/1998 | Chu et al. | 438/39 |
| 5,774,487 A | 6/1998 | Morgan | 372/45 |
| 5,778,018 A | 7/1998 | Yoshikawa et al. | 372/45 |
| 5,828,688 A | 10/1998 | Cook et al. | 372/96 |
| 5,831,960 A | 11/1998 | Jiang et al. | 369/121 |
| 5,838,715 A | 11/1998 | Corzine et al. | 372/96 |
| 5,859,866 A | 1/1999 | Forrest et al. | 372/50 |
| 5,874,730 A | 2/1999 | Yi et al. | 250/214 R |

OTHER PUBLICATIONS

"InGaAs/GaAs Vertical Cavity Surface Emitting Lasers", by G. Hill et al., 2 pgs. (Nov. 12, 1995).

(List continued on next page.)

*Primary Examiner*—Paul Ip
*Assistant Examiner*—Jeffrey Zahn
(74) *Attorney, Agent, or Firm*—Westman, Champlin & Kelly, P.A.

(57) ABSTRACT

A vertical cavity surface emitting laser, includes a first mirror, a second mirror and an active region positioned between the first and second mirrors and optically coupled to the mirrors. An increased index of refraction region in the first mirror extends in a direction generally perpendicular to the active region. The increased index of refraction region having a refractive index which is greater than a remaining portion of the first mirror and configured to produce substantially a single optical mode in the laser.

12 Claims, 2 Drawing Sheets

U.S. PATENT DOCUMENTS

| | | | | |
|---|---|---|---|---|
| 5,879,961 | A | | 3/1999 | Scott ............................ 438/32 |
| 5,886,972 | A | | 3/1999 | Jiang et al. ................. 369/116 |
| 5,893,722 | A | | 4/1999 | Hibbs-Brenner et al. ..... 438/45 |
| 5,903,585 | A | | 5/1999 | Dawson et al. ............... 372/45 |
| 5,915,165 | A | | 6/1999 | Sun et al. ..................... 438/47 |
| 5,917,848 | A | | 6/1999 | Claisse et al. ................ 372/96 |
| 5,960,024 | A | * | 9/1999 | Li et al. ........................ 372/96 |
| 6,055,262 | A | | 4/2000 | Cox et al. ..................... 372/96 |
| 6,243,407 | B1 | | 6/2001 | Mooradian ................... 372/92 |
| 6,298,076 | B1 | | 10/2001 | Caprara et al. ............... 372/43 |

OTHER PUBLICATIONS

"Transverse Mode Control of Vertical Cavity Top–Surface–Emitting Lasers", by R.A. Morgan et al., *IEEE Photonics Technology Letters,* vol. 4, No. 4, pp. 374–377, (Apr. 1993).

"Singlemode Emission from a Passive–Antiguide–Region Vertical–Cavity Surface–Emitting Laser", by Y.A. Wu et al., *Electronics Letters,* vol. 29, No. 21, pp. 1861–1863, (Oct. 14, 1993).

"Single–Mode Vertical Cavity Surface Emitting Laser by Graded–Index Lens Spatial Filtering", by B. Koch et al., *Appl. Phys. Lett.,* vol. 70, No. 18, pp. 2359–2361, (May 5, 1997).

"Optical Electronics in Modern Communications", by A. Yariv, *Oxford University Press,* pp. 76–89, (1997).

"Vertical–Cavity Surface–Emitting Lasers with Ion–Implanted Current Apertures and Index Guiding", by L.F. Chirovsky et al., *Conference on Lasers and Electro Optics,* May 7–12, 1998.

* cited by examiner

VERTICAL CAVITY SURFACE EMITTING LASER

This application claims priority benefits from U.S. provisional patent application 60/098,096, filed Aug. 27, 1998, entitled "VERTICAL CAVITY SURFACE EMITTING LASER".

GOVERNMENT RIGHTS

The United States government has certain rights in this invention pursuant to Agency Grant No. #N/N00014-95-1-0862 awarded by the Office of Naval Research.

BACKGROUND OF THE INVENTION

The present invention relates to semiconductor vertical cavity surface emitting lasers (VCSELs). More particularly, the present invention relates to VCSELS, which provide high efficiency single-mode operation.

A VCSEL is a laser produced using semiconductors in which an optically active material is positioned between two reflective layers. Typically, the optically active material can comprise materials such as gallium arsenide, indium gallium arsenide, or quaternaries such as aluminum indium gallium arsenide, indium gallium arsenide phosphide, or indium gallium arsenide nitride. The reflective layers are typically of a multi-layered dielectric material or metallic material. These layered mirrors are referred to as Bragg stacks. One of the mirrors is partially reflective as is typical of lasers such that coherent light built up in the resonating cavity between the two mirrors can pass out of the device.

Lasers have found many applications in modern technologies. In general, lasers are structures, which require optical confinement of photons, which are stimulated by pumping electrons into the device. Carrier confinement can be achieved by varying the resistivity of the materials between the electrical contacts and the active regions. Optical confinement is provided by employing materials having different refractive indexes, which act as mirrors.

The Vertical Cavity Surface Emitting Laser (VCSEL) is currently a well-established device for a variety of applications. The emission from this laser is normal to the plane of the device, and therefore, the device may be processed using standard semiconductor processing techniques, without the cleaving process required of edge-emitting devices. This manufacturing advantage is significant, since the devices can be tested before expensive packaging is performed. The beam profile is also symmetric(permitting more efficient coupling to fibers) and consists of a single longitudinal mode. These advantages make VCSEL devices less expensive to fabricate, reduce the complexity of the associated optics, and increase the performance and robustness of the entire system. For this reason, it is expected that VCSELs will be the laser of choice for an increasing number of electro-optic systems in the near future.

The structure of a VCSEL is comprised of an active region consisting of one or several quantum wells with appropriate barriers between the wells, spacer layers, and high reflectivity mirrors on either side of the active region. The mirrors consist of epitaxially deposited semiconductor material with an alternating low and high index, forming a highly reflective Bragg stack. The wavelength of emission of the laser is determined by the gain-bandwidth of the quantum wells and the cavity formed by the active region and the mirrors. There is a significant drawback to current VCSEL performance, however. Due to the small gain length, VCSEL power levels typically are small. In the current form of the VCSEL, the exciting electrical current passes through the Bragg stacks. However, since the alternating high and low index modulation is obtained with material of different bandgaps, heterojunctions result which increase the electrical resistance of the stack. Several techniques including grading of the composition, and varying the doping levels are used to reduce this resistance. A more recent innovation is to place an aperture of alumina ($Al_2O_3$), with a central region of either AlAs or $Al_xGa_{1-x}As$ (with the mole fraction $\chi$ being larger than 0.65) just above the active region so that the current funnels through this aperture center. This has resulted in VCSELs with lasing threshold currents of less than 1 mA.

Attempts to increase the power output of a VCSEL by increasing the diameter of the VCSEL have led to undesirable consequences. Currently, when the VCSEL diameter for the conventional structure is greater than about 7 μm diameter, or in the oxide VCSELS, when the oxide central aperture diameter exceeds about 2.5 μm diameter, the devices oscillate in several different transverse modes, and this results in the emission of light with as many wavelengths as there are modes. There are two major reasons for requiring single transverse mode operation. The first is that light from a multiple-transverse mode source cannot be focussed efficiently, so that coupling to devices such as single-mode fiber amplifiers is inefficient. The second reason is that the multiple wavelengths corresponding to the various transverse modes significantly compromise the operation of wavelength-sensitive systems such as single-mode optical fiber communication.

SUMMARY OF THE INVENTION

A vertical cavity surface emitting laser, includes a first mirror, a second mirror and an active region positioned between the first and second mirrors and optically coupled to the mirrors. An increased index of refraction region in the first mirror extends in a direction generally perpendicular to the active region. The increased index of refraction region having a refractive index which is greater than a remaining portion of the first mirror and configured to produce substantially a single optical mode in the laser.

DETAILED DESCRIPTION OF THE PREFERRED EMBODIMENTS

The structure of a VCSEL is comprised of an active region consisting of one or several quantum wells with appropriate barriers between the wells, spacer layers, and high reflectivity mirrors on either side of the active region. The mirrors consist of epitaxially deposited semiconductor material with an alternating low and high index, forming a highly reflective Bragg stack. The wavelength of emission of the laser is determined by the gain-bandwidth of the quantum wells and the cavity formed by the active region and the mirrors.

In the current form of the VCSEL, the exciting electrical current passes through the Bragg stacks. However, since the alternating high and low index modulation is obtained with material of different bandgaps, heterojunctions result which increase the electrical resistance of the stack. Several techniques including grading of the composition, and varying the doping levels are used to reduce this resistance. A more recent innovation is to place an aperture of alumina ($Al_2O_3$), with a central region of either AlAs or $Al_xGa_{1-x}As$ (with the mole fraction $\chi$ being larger than 0.65) just above the active region so that the current funnels through this aperture center. This has resulted in VCSELs with lasing threshold currents of less than 1 mA.

Currently, when the VCSEL diameter for the conventional structure is greater than about 7 $\mu$m. diameter, or in the oxide VCSELs, when the oxide central aperture diameter exceeds about 2.5 $\mu$m diameter, the devices oscillate in several different transverse modes, and this results in the emission of light with as many wavelengths as there are modes. There are two major reasons for requiring single transverse mode operation. The first is that light from a multiple-transverse mode source cannot be focussed efficiently, so that coupling to devices such as single-mode fiber amplifiers is inefficient. The second reason is that the multiple wavelengths corresponding to the various transverse modes significantly compromise the operation of wavelength-sensitive systems such as single-mode optical fiber communication.

A number of techniques have been used for forcing the devices to operate in single mode; these include spatial filtering (R. A. Morgan, G. D. Guth, M. W. Focht, M. T. Asom, K. Kojima, L. E. Rogers, S. E. Callis, "Transverse Mode Control Of Vertical-Cavity Top-Surface-Emitting Lasers," *IEEE Photon. Tech. Lett.*, Vol. 4, pp. 374–376, 1993), anti guiding techniques (Y. A. Wu, C. J. Chang-Hasnain, R. Nabiev, "Single Mode Emission From a Passive Antiguiding Region Vertical Cavity Surface Emitting Laser," *Electronics Lett.*, Vol 29, pp. 1861–1863, 1993), and external cavity techniques (Barry J. Koch, James R. Leger, Anand Gopinath, "Single-Mode Vertical Cavity Surface Emitting Laser By Graded Index Lens Spatial Filtering," *Appl. Phys. Lett.*, Vol. 70, pp. 2359–2361, 1997). These techniques have resulted in VCSEL power output being limited to less than 5 mW.

Figure 1:
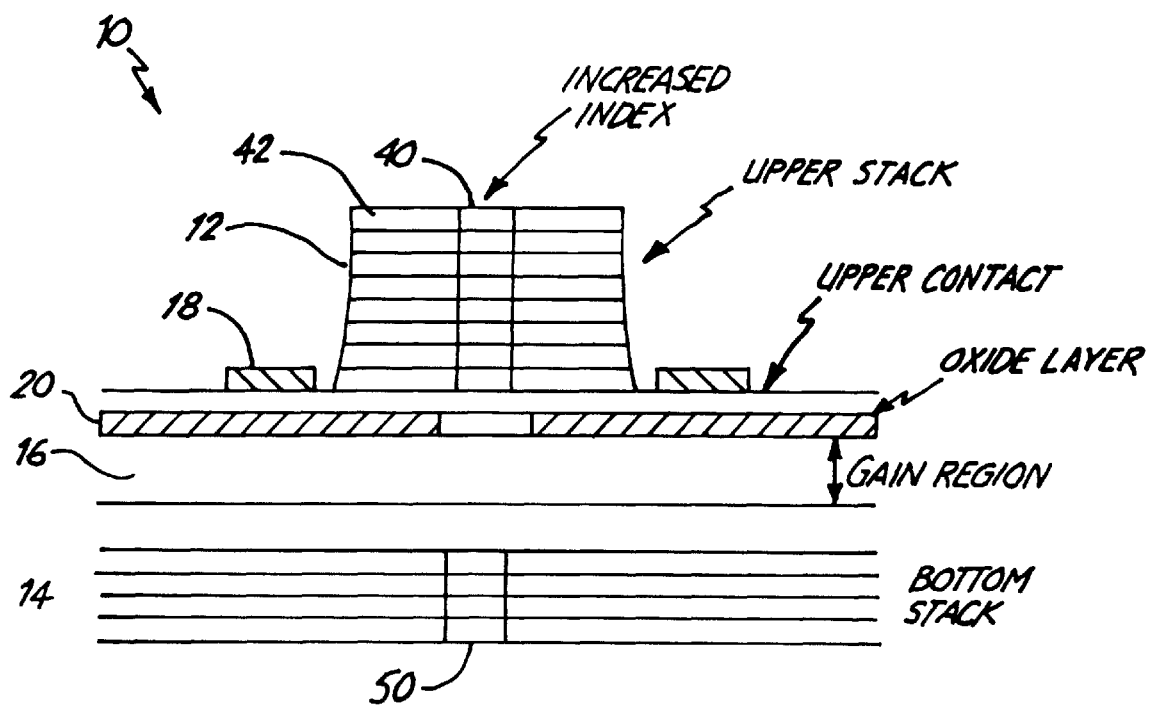
FIG. 1 is a cross-sectional view of a vertical cavity surface emitting laser (VCSEL) in accordance with one embodiment of the present invention.

The present invention provides a technique for forcing VCSELs to operate in a single mode and emit light at a single wavelength. In this invention, one or both of the Bragg stack mirrors are altered to support and transmit a single mode, and thus a single wavelength, where the line width is determined by the device. FIG. 1 shows an oxide VCSEL 10 including a top Bragg stack 12 and a bottom Bragg stack 14 sandwich an active region 16. An annular upper electrical contact 18 and a bottom electrical contact (not shown) are used to pump carriers into the device. FIG. 1 also shows an optional $Al_2O_3$ aperture 20, which focuses the carriers into a portion of the active region 16.

In FIG. 1, the top Bragg stack 12 includes a central increased index of refraction region 40 having an index of refraction which is greater than an outer radius region 42 of the stack 12. Suppose that the VCSEL wavelength is designed to be $\lambda_0$ by proper design of the quantum wells, the Bragg stack, and other parameters. Furthermore, suppose this central region of increased index is circular of radius $\alpha$, and index $n_1$, and the region outside has an index $n_2$. A parameter V may be defined as $$V = \frac{2\pi}{\lambda_0}\alpha(n_1^2 - n_2^2)^{\frac{1}{2}} 1$$

For values of V less than 2.405, the propagation in the Bragg stack is confined to a single low-order mode. For a sufficiently long Bragg stack, the higher-order modes are filtered out and the emission from the VCSEL becomes single mode. If the central region is not circular but square or other shape, then an equivalent radius may be defined, so that this condition is satisfied. The origin of this condition is in the design of single mode step index fibers, and this condition ensures that the fiber is single mode, since this is the first zero of the Bessel function of the first kind $J_0$, and this condition is derived in a number of standard textbooks (for example see Amon Yariv, "Optical Electronics in Modern Communications," *Oxford University Press*, pp. 76–89, 1997). Furthermore, by making the V number smaller, the mode size becomes larger, and thus, the larger diameter VCSELs may be forced to operate in a single mode. One technique to increase the central region index, (but not the sole technique for this invention), is to proton-bombard or ion-implant the region with an appropriate atomic species, so that the index increases. This bombardment or implantation generally causes damage, and therefore annealing may be necessary to reduce the incurred losses.

A conventional VCSEL, without the oxide aperture 20 may also be treated similarly, except that the effect of the bombardment or implantation results in removal of the carriers, and thus increases the index. Thus, the current flow through the VCSEL Bragg stack will occur in a ring, and subsequently just before the active region, it also flows in the center.

One alternative technique is to use the central active region with appropriate contacts for current flow, with Bragg stacks, which are not monolithic with the active region. For example, a hybrid form of the device could be constructed using a single mode fiber with gratings. Dielectric Bragg stack mirrors with an enhanced central region with the appropriate V number may also be used. Again to ensure that the central region of the active part of the laser is pumped with current, an oxide aperture is preferred, but not essential.

Additional apertures may also be incorporated to provide additional filtering to ensure single mode operation, and all other techniques may also be used, to assist the method discussed here. VCSELs operating at 980 nm are currently feasible, and high power single mode VCSELs would be of interest as pumps for the Erbium Doped Fiber Amplifiers, for output powers ranging from 25 mW to 300 mW. Single mode VCSELs at 1017 nm would also be useful for the Praseodymium Doped Fiber Amplifiers, and here the needs for higher pump powers is greater because Pr is much less efficient. Current research is in the design and fabrication of long wavelength VCSELs at 1300 nm and at 1530 nm, and single mode VCSELs here with high output powers would be of great interest for telecommunication applications. VCSELs offer several advantages as reviewed above, including simple and inexpensive fabrication and packaging, less costly optical components, and increased system performance.

Figure 2:
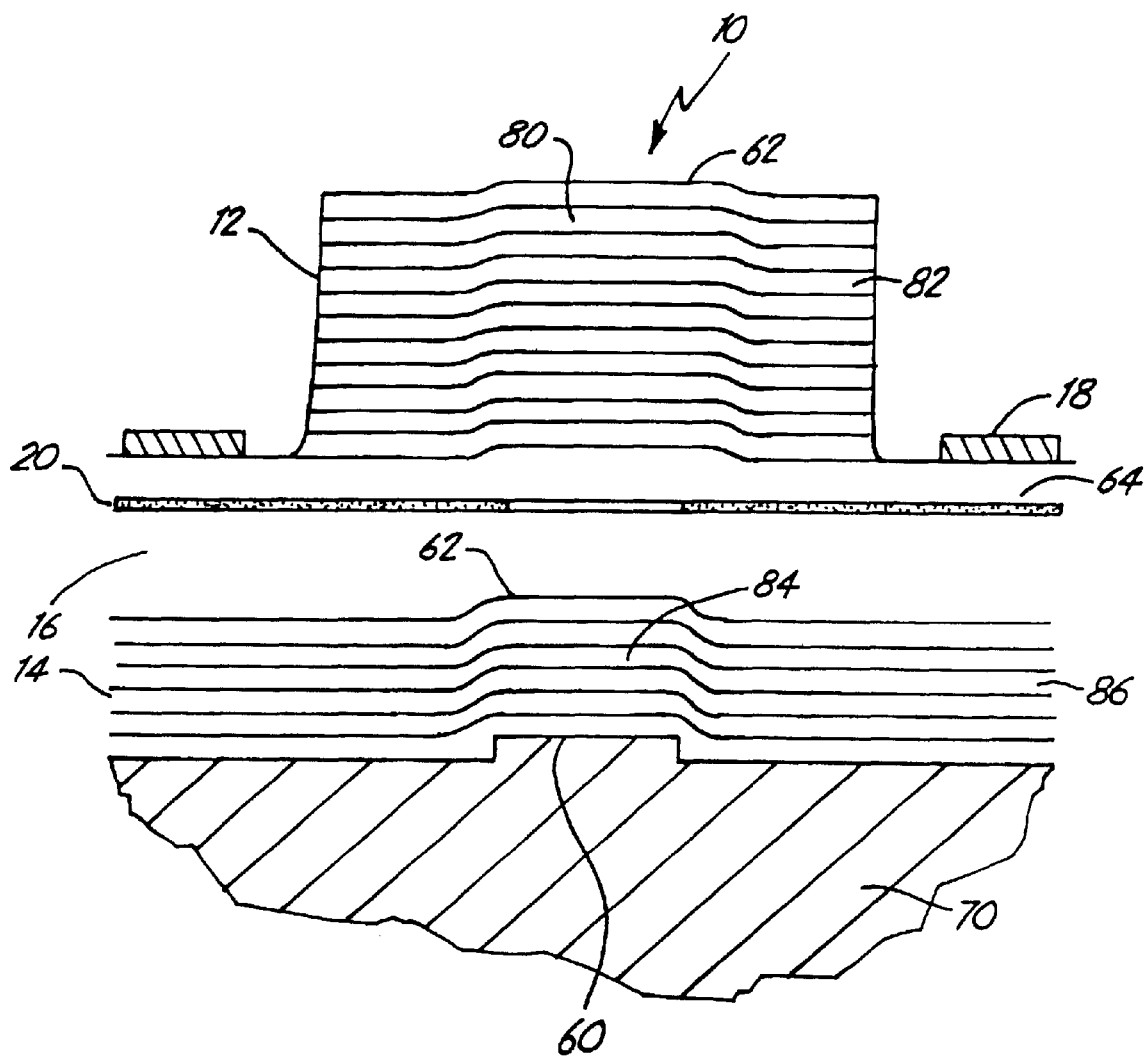
FIG. 2 is a cross-sectional view of a vertical cavity surface emitting laser (VCSEL) in accordance with one embodiment of the present invention.

FIG. 2 shows an alternative embodiment of the VCSEL 10 utilizing a step 60 formed in the gallium arsenide substrate 70 using chemical/wet etching techniques. Step 60 is preferably sized to produce pillars 62, which are 10 nm to 70 nm high and have diameters in the range of 4 $\mu$m to 10 $\mu$m. The VCSEL 10 semiconductor bottom Bragg stack 14, upper Bragg stack 12, and active region 16 are epitaxially grown on substrate 70, and the wafer is processed so that the pillars 62 central in the structure of the VCSEL 10. This method provides an increased index of refraction region or stepped region 80 for the top Bragg stack 12 relative to the radius region 82 of stack 12. Additionally, step 60 provides an increased index of refraction region or stepped region 84 of bottom Bragg stack 14 relative to radius region 86 of stack 14. Annealing is not necessary in this embodiment of the invention.

As the pillars 62 become increasingly smoothed over in the upper layers, the increase in the index of refraction is reduced. To ensure single mode behavior of the VCSEL 10, further enhancement to the index of refraction of the top Bragg stack 10 may be achieved through proton-bombardment or ion-implantation of the stepped region 80 of the top Bragg stack 12, as discussed above. A similar enhancement could be made to the stepped region 84 of the lower Bragg stack 14. Alternatively, it is possible to etch the top of the contact layer 64 an to re-grow the upper Bragg stack 12 to reduce the smoothing of the pillars 64 in the upper Bragg stack 12.

Although the present invention has been described with reference to preferred embodiments, workers skilled in the art will recognize that changes may be made in form and detail without departing from the spirit and scope of the invention. For example, the bottom Bragg stack 14 can also or alternatively include on increased index of refraction region 50 made using similar techniques.

Although the present invention has been described with reference to preferred embodiments, workers skilled in the art will recognize that changes may be made in form and detail without departing from the spirit and scope of the invention.

What is claimed is:

1. A vertical cavity surface emitting laser, comprising:
   a first mirror;
   a second mirror;
   an active region positioned between the first and second mirrors and optically coupled to the mirrors; and
   an increased index of refraction region in the first mirror extending in a direction generally perpendicular to the active region, the increased index of refractive region having a refractive index which is greater than a remaining portion of the first mirror and a V number of less than 2.405 to thereby produce substantially a single optical mode in the laser.

2. The vertical cavity surface emitting laser of claim 1 including a second increased index of refraction region in the second mirror extending in a direction generally perpendicular to the active region, the measured index of refractive region having a refractive index which is greater than a remaining portion of the second mirror and configured to produce substantially a single optical mode on the laser.

3. The vertical cavity surface emitting laser of claim 1 wherein the increased index of refraction region has a reduced carrier density.

4. The vertical cavity surface emitting laser of claim 3 wherein the increased index of refraction region is formed through ion implantation.

5. The vertical cavity surface emitting laser of claim 4 wherein the laser has been annealed following the ion implantation.

6. The vertical cavity surface emitting laser of claim 2, wherein the increased index of refraction regions of the first and second mirrors are stepped regions.

7. The vertical cavity surface emitting laser of claim 6 including a substrate and wherein a step is formed in the substrate whereby layers deposited on the substrate have a profile which conforms to the step.

8. The vertical cavity surface emitting laser of claim 1 wherein the first mirror comprises a Bragg stack.

9. The vertical cavity surface emitting laser of claim 1 wherein the increased index of refraction region is circular.

10. The vertical cavity surface emitting laser of claim 1 wherein the increased index of refraction region is square.

11. The vertical cavity surface emitting laser of claim 6 including an oxide layer between the first mirror and the active region.

12. The vertical cavity surface emitting laser of claim 11 wherein an oxide layer includes an aperture formed therein generally aligned with the region of increased refraction.

* * * * *